(12) United States Patent
Tang

(10) Patent No.: US 8,168,464 B2
(45) Date of Patent: May 1, 2012

(54) MICROELECTRONIC ASSEMBLY WITH AN EMBEDDED WAVEGUIDE ADAPTER AND METHOD FOR FORMING THE SAME

(75) Inventor: Jinbang Tang, Chandler, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 208 days.

(21) Appl. No.: 12/692,979

(22) Filed: Jan. 25, 2010

(65) Prior Publication Data

US 2011/0180917 A1 Jul. 28, 2011

(51) Int. Cl.
*H01L 21/00* (2006.01)
(52) U.S. Cl. ............... 438/67; 438/64; 438/66; 257/684
(58) Field of Classification Search ............... 438/64, 438/66, 67; 257/684
See application file for complete search history.

(56) References Cited

U.S. PATENT DOCUMENTS

| | | | |
|---|---|---|---|
| 5,867,073 A | 2/1999 | Weinreb et al. | |
| 5,912,598 A | 6/1999 | Stones et al. | |
| 6,958,662 B1 | 10/2005 | Salmeda et al. | |
| 7,081,370 B2 * | 7/2006 | Kumagai et al. | 438/69 |
| 7,276,987 B2 | 10/2007 | Koriyama | |
| 7,463,109 B2 | 12/2008 | Iio | |
| 7,486,156 B2 | 2/2009 | Lee et al. | |
| 7,928,914 B2 * | 4/2011 | Bit-Babik et al. | 343/702 |
| 2009/0085133 A1 * | 4/2009 | Doan | 257/428 |

FOREIGN PATENT DOCUMENTS

EP 0874415 A2 10/1998
* cited by examiner

*Primary Examiner* — Jarrett Stark
*Assistant Examiner* — John M Parker
(74) *Attorney, Agent, or Firm* — Ingrassia Fisher & Lorenz, PC

(57) ABSTRACT

A microelectronic assembly and a method for forming a microelectronic assembly are provided. A semiconductor substrate (22) is provided. The semiconductor substrate (22) has first and second opposing sides (24, 26) and first and second portions (28, 30). A tuning depression (32) is formed on the second opposing side and the second portion of the semiconductor substrate. A radio frequency conductor (34) is formed on the first opposing side (24) of the first semiconductor substrate. The radio frequency conductor (34) has a first end (46) on the first portion (28) of the first semiconductor substrate (22) and a second end (48) on the second portion (30) of the first semiconductor substrate (22). A microelectronic die (78) having an integrated circuit formed therein is attached to the first opposing side (24) and the first portion (28) of the semiconductor substrate (22) such that the integrated circuit is electrically connected to the first end (46) of the radio frequency conductor (34).

20 Claims, 5 Drawing Sheets

MICROELECTRONIC ASSEMBLY WITH AN EMBEDDED WAVEGUIDE ADAPTER AND METHOD FOR FORMING THE SAME

FIELD OF THE INVENTION

The present invention generally relates to a microelectronic assembly and a method for forming a microelectronic assembly, and more particularly relates to a microelectronic assembly having an embedded waveguide adapter as an interface.

BACKGROUND OF THE INVENTION

Integrated circuits are formed on semiconductor substrates, or wafers. The wafers are then sawed into microelectronic dies (or "dice"), or semiconductor chips, with each die carrying, for example, a respective integrated circuit (e.g., a microprocessor) or a microelectromechanical system (MEMS) device (e.g., an accelerometer). In some examples, each semiconductor chip is mounted to a package or carrier substrate using either wirebonding or "flip-chip" connections. The packaged chip is then typically mounted to a circuit board, or motherboard, before being installed in a system, such as an electronic or a computing system.

While lower frequency applications typically use direct conductive connections (e.g., vias and solder formations) to connect to the circuit board, higher frequency applications, such as millimeter wave devices, often use electromagnetic coupling and a waveguide structure. In order to achieve the desired performance in the higher frequency applications, the package substrate must be precisely manufactured, which typically involves manufacturing processes that are not compatible with conventional semiconductor manufacturing processes. As a result, manufacturing costs are increased.

Accordingly, it is desirable to provide an improved method for forming a microelectronic assembly for use in high frequency applications that allows the required performance to be achieved while minimizing costs. Other desirable features and characteristics of the invention will become apparent from the subsequent detailed description and the appended claims, taken in conjunction with the accompanying drawings and the foregoing technical field and background.

BRIEF DESCRIPTION OF THE DRAWINGS

The various embodiments will hereinafter be described in conjunction with the following drawings, wherein like numerals denote like elements.

DETAILED DESCRIPTION OF THE INVENTION

The following detailed description is merely exemplary in nature and is not intended to limit the invention or application and uses of the invention. Furthermore, there is no intention to be bound by any expressed or implied theory presented in the preceding technical field, background, brief summary, or the following detailed description. It should also be noted that FIGS. 1-9 are merely illustrative and may not be drawn to scale.

FIG. 1 to FIG. 9 illustrate a microelectronic assembly and a method for forming a microelectronic assembly. First and second semiconductor substrates (or portions of substrates) are provided. Each semiconductor substrate has first and second portions and first and second opposing sides. A first tuning depression is formed on the second opposing side and the second portion of the first semiconductor substrate. A radio frequency (RF) conductor is formed on the first opposing side of the first semiconductor substrate. The radio frequency conductor has a first end on the first portion of the first semiconductor substrate and a second end on the second portion of the first semiconductor substrate. A microelectronic die having an integrated circuit formed therein is attached to the first opposing side and the first portion of the first semiconductor substrate such that the integrated circuit is electrically connected to the first end of the radio frequency conductor. A second tuning depression is formed on the second opposing side and the second portion of the second semiconductor substrate. A die depression is formed on the second opposing side and the first portion of the second semiconductor substrate. The second semiconductor substrate is attached to the first semiconductor substrate such that the first opposing side of the first semiconductor substrate is adjacent to the second opposing side of the second semiconductor substrate, the microelectronic die is at least partially positioned within the die depression, and the second end of the radio frequency conductor is positioned between the first and second tuning depressions.

Figure 1:
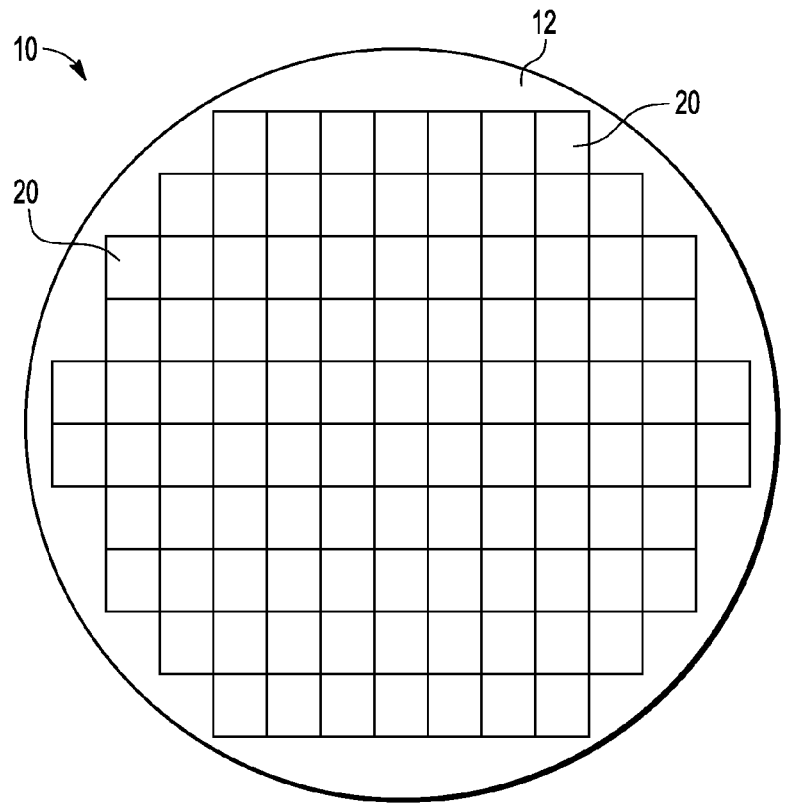
FIG. 1 is a top plan view of a semiconductor substrate.
Figure 2:
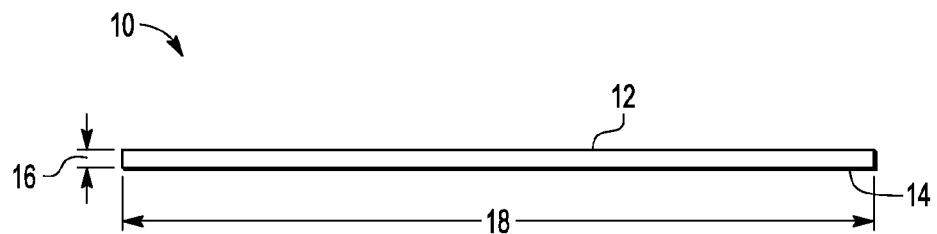
FIG. 2 is a side view of the semiconductor substrate of FIG. 1.

Referring to FIGS. 1 and 2, there is illustrated a semiconductor substrate 10. The semiconductor substrate 10 is made of a semiconductor material, such as silicon (Si), gallium arsenide (GaAs), gallium nitride (GaN), or a combination thereof. The substrate 10 has an upper (or first) surface (or side) 12, a lower (or second) surface 14, and a thickness 16 of, for example, between approximately 50 and 300 micrometers ($\mu$m). In the depicted embodiment, the substrate 10 is a semiconductor wafer with a diameter 18 of, for example, approximately 150, 200, or 300 millimeters (mm). As illustrated specifically in FIG. 1, the substrate 10 may include, or be divided into, multiple packages (or package portions) 20. It should be noted that although the following description and accompanying drawings may only refer to a single microelectronic assembly, it should be understood that many, if not all, of the process steps used to form the assembly be performed on substantially the entire substrate 10 (e.g., all of the package portions 20) simultaneously such that multiple microelectronic assemblies are formed simultaneously.

Figure 3:
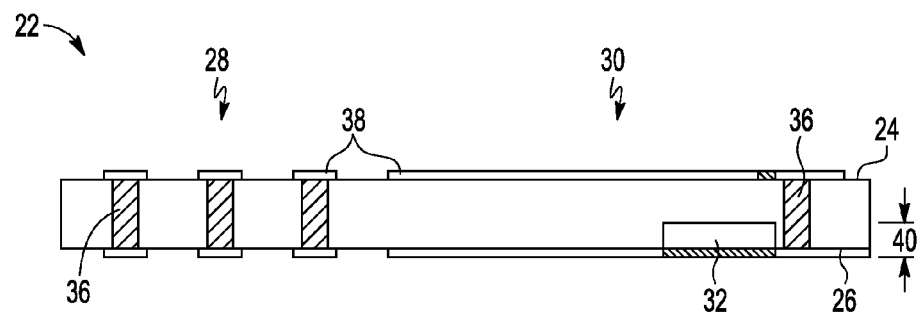
FIG. 3 is a cross-sectional side view of a portion of a semiconductor substrate that may be similar to that shown in FIGS. 1 and 2.
Figure 4:
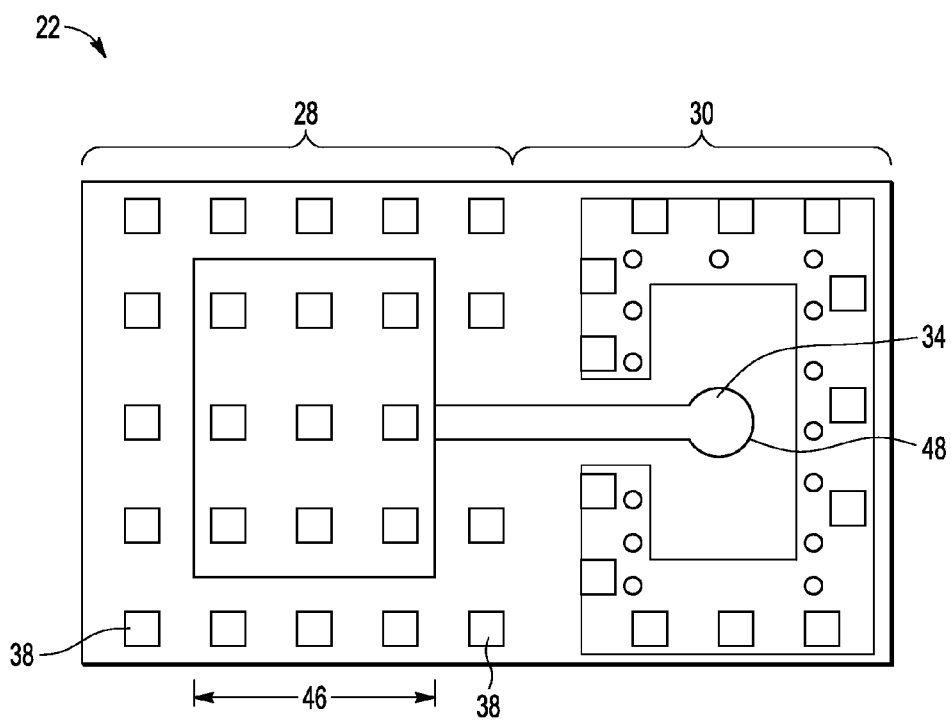
FIG. 4 is a top plan view of the portion of the semiconductor substrate of FIG. 3.
Figure 5:
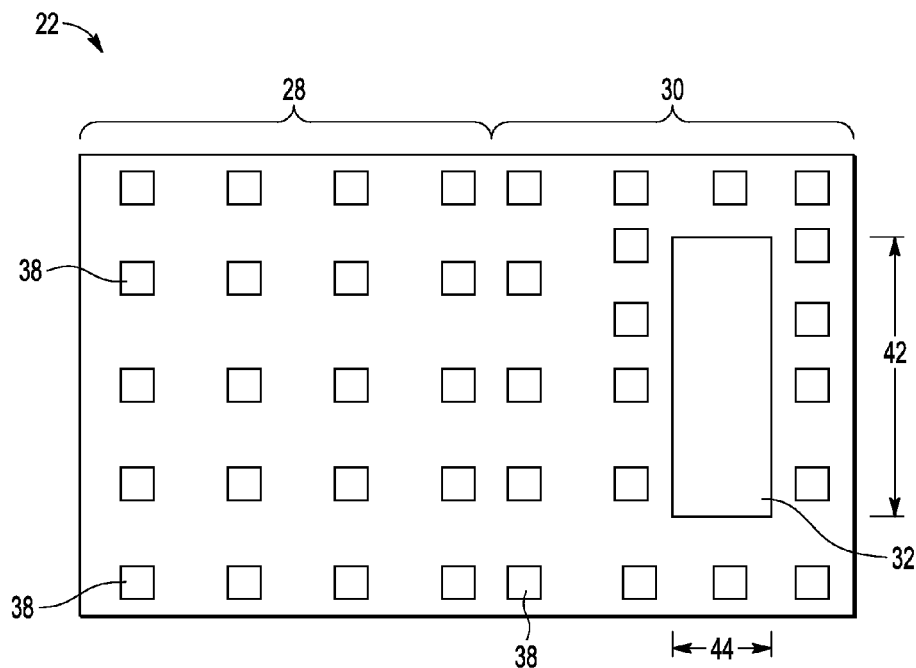
FIG. 5 is a bottom plan view of the portion of the semiconductor substrate of FIG. 3.

FIGS. 3-5 illustrate a package substrate 22, which may be one of the package portions 20 of the semiconductor substrate 10 shown in FIGS. 1 and 2 and have an upper surface 24 and a lower surface 26 (corresponding to surfaces 12 and 14, respectively). The package substrate 22 may also have a first portion (or end) 28 and a second portion 30. In the depicted embodiment, the package substrate 22 includes a (first) tuning depression 32, a radio frequency (RF) conductor (or antenna or coupler) 34, a conductive vias 36, and conductive leads and bond pads 38.

The tuning depression 32 is on the lower surface 26 and second portion 30 of the package substrate 22 and may be formed using standard semiconductor substrate processing techniques, such as a chemical etching process. The tuning depression 32 may have, for example, a depth 40 of between 10 and 50 nm, a length 42 of between 3 and 5 mm, and a width 44 of between 1 and 2 mm.

Referring specifically to FIG. 4, the RF conductor 34 is on the upper surface 24 of the package substrate 22 and includes a first end 46 on the first portion 28 of the package substrate 22 and a second end (or a coupling tip) 48 on the second portion 30 of the package substrate 22. The RF conductor 34, the conductive vias 36, and the conductive leads and bond pads 38 are also formed using conventional semiconductor processing methods for forming conductive structures (e.g., damascene processing, electroplating, sputtering, etc.) and may be made of, for example, copper, aluminum, gold, or a combination thereof. As will be appreciated by one skilled in the art, the arrangement of the conductive vias 36 and leads and bond pads 38, particularly on the second portion 30 of the package substrate 22, may be combined with the dimensions of the tuning depression 32 to provide particular electrical characteristics as will be made clear below.

Figure 6:
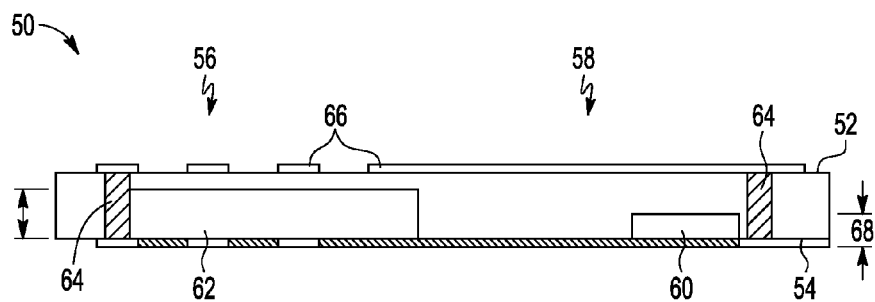
FIG. 6 is a cross-sectional side view of a portion of a semiconductor substrate that may be similar to that shown in FIGS. 1 and 2.
Figure 7:
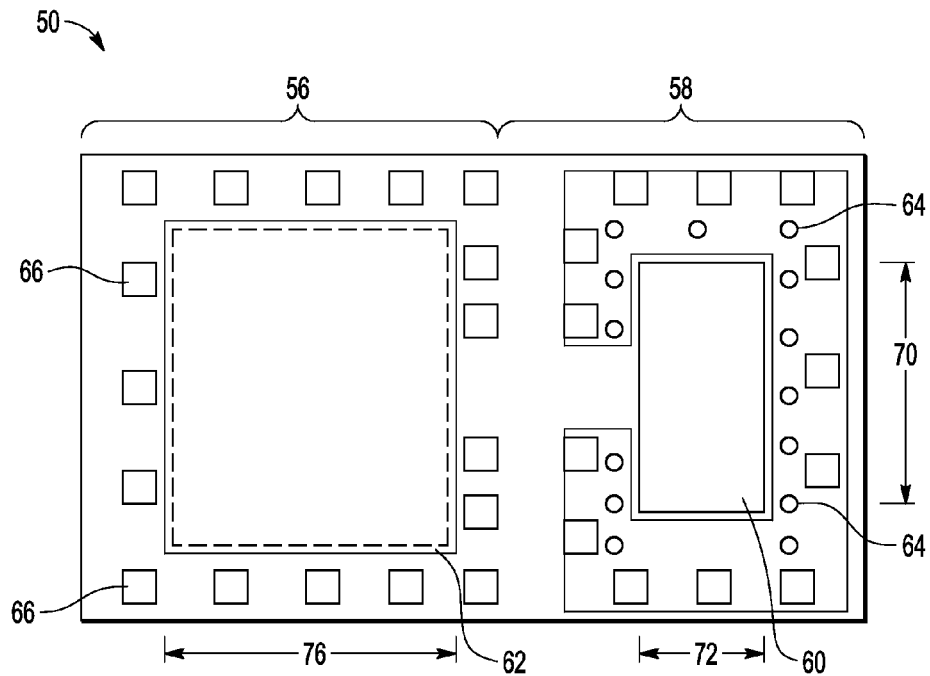
FIG. 7 is a bottom plan view of the portion of the semiconductor substrate of FIG. 6.

FIGS. 6 and 7 illustrate a package cap 50, according to one embodiment of the present invention. Like the package substrate 22, the package cap 50 may be formed from one of the package portions 20 of the semiconductor substrate 10 (i.e., not from the exact same substrate 10, but a similar one). The package cap 50 has an upper surface 52 and a lower surface 54 (corresponding to surfaces 12 and 14 of substrate 10, respectively). The package cap 50 may also have a first portion (or end) 56 and a second portion 58. In the depicted embodiment, the package cap 50 includes a (second) tuning depression 60, a die depression 62, a conductive vias 64, and conductive leads and bond pads 66.

The second tuning depression 60 is on the lower surface 54 and second portion 58 of the package cap 50, and the die depression 62 is on the lower surface 54 and the first portion 56 of the package cap 50. Like many features of the microelectronic assembly described herein, the second tuning depression 60 and the die depression 62 may be formed using standard semiconductor substrate processing techniques, such as a chemical etching process. The second tuning depression 60 may have, for example, a depth 68 of between 10 and 50 µm, a length 70 of between 3 and 5 mm, and a width 72 of between 1 and 2 mm. The die depression 62 may be substantially square with, for example, a depth 74 of between 60 and 150 µm and a side length 76 of between 3 and 5 mm.

The conductive vias 64 and the conductive leads and bond pads 66 are also formed using conventional semiconductor processing methods for forming conductive structures (e.g., damascene processing, electroplating, sputtering, etc.) and may be made of, for example, copper, aluminum, gold, or a combination thereof. As will be appreciated by one skilled in the art, the arrangement of the conductive vias 64 and leads and bond pads 66, particularly on the second portion 58 of the package cap 50, may be combined with the dimensions of the second tuning depression 60 to provide particular electrical characteristics as will be made clear below.

Figure 8:
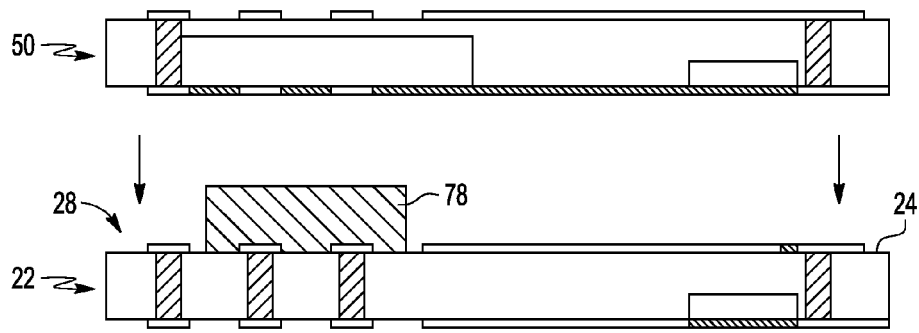
FIG. 8 is a cross-sectional side view of the substrate portions of FIGS. 3 and 6 illustrating the substrate portions being attached.

Referring to FIG. 8, after the package substrate 22 and the package cap 50 have been completed, the respective wafers 10 from which they are formed may be separated into individual substrates (e.g., substrate 22 and package 50) and the attached as shown. A microelectronic die 78 is first mounted or attached to the upper side 24 and the first portion 28 of the package substrate 22. It should be understood that in other embodiments, the assembly process may be performed before the respective wafers 10 are separated.

As will be appreciated by one skilled in the art, the microelectronic die 78 has an integrated circuit formed thereon (or therein). Although not shown, the die 78 may include a substrate with multiple semiconductor devices formed thereon and a build-up (or backend) layer formed over the substrate and the semiconductor devices. The semiconductor devices are, for example, semiconductor transistors that include source regions, drain regions, and gate formations (including a gate electrode and a gate dielectric layer), as is commonly understood, and may at least partially form an integrated circuit (along other various components such as resistors, capacitors, and inductors), such as a microprocessor or an application specific integrated circuit (ASIC). The integrated circuit may be formed using, for example, masking (e.g., lithography), reactive ion etching (RIE), physical sputtering, damascene patterning, physical vapor deposition, electroplating, and chemical vapor (CVD), low pressure chemical vapor (LPCVD), and/or plasma enhanced chemical vapor deposition (PECVD) techniques. For example, the integrated circuit may be manufactured using complementary metal-oxide semiconductor (CMOS) processing techniques.

In one embodiment, the integrated circuit is a millimeter wave (mmW) device. The microelectronic die 78 is attached such that the integrated circuit is electrically connected to the first end 46 of the RF conductor 34 (FIG. 4) and at least some of the conductive vias 36 extending through the package substrate 22.

Figure 9:
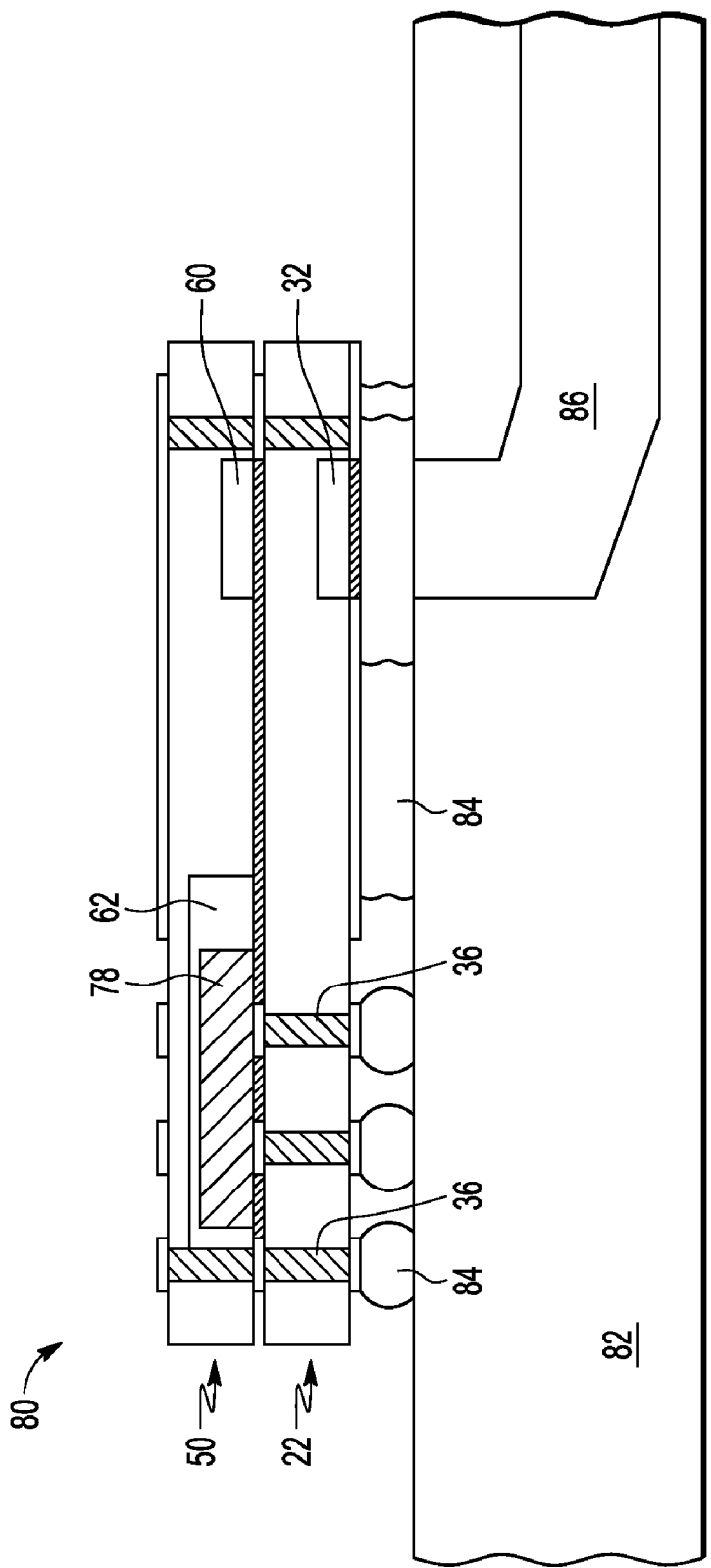
FIG. 9 is a cross-sectional side view of a microelectronic assembly in accordance with one aspect of the present invention attached to a circuit board.

Referring to FIG. 9, when the package cap 50 is attached to the package substrate 22, the microelectronic die 78 is positioned (at least partially) in the die depression 62 of the cap 50. It should also be noted that although not clearly shown the second end 48 of the RF conductor 34 (FIG. 4) may be positioned directly between the first tuning depression 32 and the second tuning depression 60. As will be appreciated by one skilled in the art, the package cap 50 may be attached to the package substrate 22 using known techniques, such as soldering or heat bonding the contacts pads on each component. After attached as shown in FIG. 9, the package cap 50 and the package substrate 22 may form a device package (or module or microelectronic assembly) 80.

Still referring to FIG. 9, in one embodiment, the device package 80 is then mounted to a circuit board 82 using, for example, contact formations 84 such as solder bumps, which also provide electrical signals (I/O) to the integrated circuit in the microelectronic die 78 through the conductive vias 36. As shown, the circuit board 82 also includes a waveguide, or waveguide adapter, 86 which is arranged such that its input section is aligned with the tuning depressions 32 and 60.

During operation, the integrated circuit within the microelectronic die 78 sends and receives critical signals (such as mmW signals) through the interface (or tuning depression 32) to the circuit board 82. For example, a field may propagate from the RF conductor 34 through the tuning depression 32 and into the waveguide 86 where it is directed to another sub-system.

One advantage is that because of the precision with which the tuning depressions may be formed (e.g., using modern semiconductor processing techniques) the electrical characteristics, including impedance matching, of the microelectronic assembly may be accurately controlled. As a result, the structure formed by the tuning depressions, the various conductors formed on the substrates, and the substrates themselves may be configured to effectively perform as a waveguide adapter and direct the EM field generated by the RF conductor into the waveguide on the circuit board. Another advantage is that because processing techniques may be used that are already employed for other types of assemblies overall manufacturing costs are minimized.

In one embodiment, a method for forming a microelectronic assembly is provided. First and second semiconductor substrates are provided. Each semiconductor substrate has first and second portions and first and second opposing sides. A first tuning depression is formed on the second opposing side and the second portion of the first semiconductor substrate. A radio frequency conductor is formed on the first opposing side of the first semiconductor substrate. The radio frequency conductor has a first end on the first portion of the first semiconductor substrate and a second end on the second portion of the first semiconductor substrate. A microelectronic die having an integrated circuit formed therein is attached to the first opposing side and the first portion of the first semiconductor substrate such that the integrated circuit is electrically connected to the first end of the radio frequency conductor. A second tuning depression is formed on the second opposing side and the second portion of the second semiconductor substrate. A die depression is formed on the second opposing side and the first portion of the second semiconductor substrate. The second semiconductor substrate is attached to the first semiconductor substrate such that the first opposing side of the first semiconductor substrate is adjacent to the second opposing side of the second semiconductor substrate, the microelectronic die is at least partially positioned within the die depression, and the second end of the radio frequency conductor is positioned between the first and second tuning depressions.

The semiconductor substrate may include a semiconductor material. The semiconductor material may be silicon, gallium arsenide, gallium nitride, or a combination thereof. The first and second tuning depressions may be formed using a semiconductor chemical etch process.

The integrated circuit may be a millimeter wave (mmW) device. The method may also include forming a plurality of conductive vias in the first semiconductor substrate and the second semiconductor substrate. Each of the conductive vias may extend between the first and second opposing sides of the respective substrate.

At least some of the conductive vias may be formed in the first portion of the first semiconductor substrate and electrically connected to the integrated circuit when the microelectronic die is attached to the first portion of the first semiconductor substrate. The first and second semiconductor substrates may be semiconductor wafers.

In another embodiment, a method for forming a microelectronic assembly is provided. A semiconductor substrate having first and second opposing sides and comprising a plurality of package portions is provided. Each of the plurality of package portions has a first and a second portion. A plurality of tuning depressions are simultaneously formed on the second opposing side of the semiconductor substrate. Each of the plurality of tuning depressions are on the second portion of a respective one of the package portions. A plurality of radio frequency conductors are simultaneously formed on the first opposing side of the semiconductor substrate. Each of the plurality of radio frequency conductors has a first end on the first portion of a respective one of the package portions and a second end on the second portion of the respective one of the package portions. A microelectronic die having an integrated circuit formed therein is attached to the first portion of each of the package portions of the semiconductor substrate such that the integrated circuit is electrically connected to the first end of the radio frequency conductor on the respective package portion.

The method may also include separating the semiconductor substrate into the plurality of package portions. The semiconductor material may be silicon, gallium arsenide, gallium nitride, or a combination thereof. The semiconductor substrate may be a semiconductor wafer. The integrated circuit in each of the microelectronic dies may be a millimeter wave (mmW) device.

The method may also include forming a plurality of conductive vias in each of the package portions of the semiconductor substrate. Each of the conductive vias may extend between the first and second opposing sides of the semiconductor substrate.

At least some of the conductive vias may be formed in the first portion of each of package portions of the semiconductor substrate and electrically connected to the integrated circuit when the respective microelectronic die is attached to the first portion of the package portion.

A second semiconductor substrate having first and second opposing sides and including a plurality of second package portions may also be provided. Each of the second package portions may have a first portion and a second portion. A plurality of second tuning depressions may also be simultaneously formed on the second opposing side of the second semiconductor substrate. Each of the plurality second tuning depressions may be on the second portion of a respective one of the second package portions. A plurality of die depressions may also be simultaneously formed on the second opposing side of the second semiconductor substrate. Each of the plurality die depressions may be on the first portion of a respective one of the second package portions. Each of the second package portions of the second semiconductor substrate may also be attached to a respective one of the package portions of the semiconductor substrate such that the first opposing side of each of the package portions is adjacent to the second opposing side of the respective second package portion, the microelectronic die on each package portion may be at least partially positioned within the die depression of the respective second package portion, and the second end of each radio frequency conductor may be positioned between the respective first and second tuning depressions.

In a further embodiment, a microelectronic assembly is provided. A first semiconductor substrate has first and second portions and first and second opposing sides. The first semiconductor includes a first tuning depression on the second opposing side and the second portion thereof and a radio frequency conductor on the first opposing side thereof. The radio frequency conductor has a first end on the first portion thereof and a second end on the second portion thereof. A microelectronic die has an integrated circuit formed therein and is attached to the first opposing side and the first portion of the first semiconductor substrate such that the integrated circuit is electrically connected to the first end of the radio frequency conductor. A second semiconductor substrate having first and second portions and first and second opposing sides is attached to the first semiconductor substrate such that the first opposing side of the first semiconductor substrate is adjacent to the second opposing side of the second semiconductor substrate. The second semiconductor substrate includes a second tuning depression on the second opposing side and the second portion thereof and a die depression on the second opposing side and the first portion thereof. The second end of the radio frequency conductor is positioned between the first and second tuning depressions and the microelectronic die is at least partially positioned within the die depression.

The semiconductor substrate may include silicon, gallium arsenide, gallium nitride, or a combination thereof. The integrated circuit may be a millimeter wave (mmW) device.

The microelectronic assembly may also include a plurality of conductive vias in the first semiconductor substrate and the second semiconductor substrate. Each of the conductive vias may extend between the first and second opposing sides of the respective substrate. At least some of the conductive vias may be in the first portion of the first semiconductor substrate and electrically connected to the integrated circuit when the microelectronic die is attached to the first portion of the first semiconductor substrate.

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims and their legal equivalents.

What is claimed is:

1. A method for forming a microelectronic assembly comprising:
   providing first and second semiconductor substrates, each semiconductor substrate having first and second portions and first and second opposing sides;
   forming a first tuning depression on the second opposing side and the second portion of the first semiconductor substrate;
   forming a radio frequency conductor on the first opposing side of the first semiconductor substrate, the radio frequency conductor having a first end on the first portion of the first semiconductor substrate and a second end on the second portion of the first semiconductor substrate;
   attaching a microelectronic die having an integrated circuit formed therein to the first opposing side and the first portion of the first semiconductor substrate such that the integrated circuit is electrically connected to the first end of the radio frequency conductor;
   forming a second tuning depression on the second opposing side and the second portion of the second semiconductor substrate;
   forming a die depression on the second opposing side and the first portion of the second semiconductor substrate; and
   attaching the second semiconductor substrate to the first semiconductor substrate such that the first opposing side of the first semiconductor substrate is adjacent to the second opposing side of the second semiconductor substrate, the microelectronic die is at least partially positioned within the die depression, and the second end of the radio frequency conductor is positioned between the first and second tuning depressions.

2. The method of claim 1, wherein the first and second semiconductor substrates comprise a semiconductor material, and wherein the semiconductor material is silicon, gallium arsenide, gallium nitride, or a combination thereof.

3. The method of claim 2, wherein the first and second tuning depressions are formed using a semiconductor chemical etch process.

4. The method of claim 3, wherein the integrated circuit is a millimeter wave (mmW) device.

5. The method of claim 4, further comprising forming a plurality of conductive vias in the first semiconductor substrate and the second semiconductor substrate, each of the conductive vias extending between the first and second opposing sides of the respective substrate.

6. The method of claim 5, wherein at least some of the conductive vias are formed in the first portion of the first semiconductor substrate and are electrically connected to the integrated circuit when the microelectronic die is attached to the first portion of the first semiconductor substrate.

7. The method of claim 6, wherein the first and second semiconductor substrates are semiconductor wafers.

8. A method for forming a microelectronic assembly comprising:
   providing a semiconductor substrate having first and second opposing sides and comprising a plurality of package portions, each of the plurality of package portions having a first and a second portion;
   simultaneously forming a plurality of tuning depressions on the second opposing side of the semiconductor substrate, each of the plurality of tuning depressions being on the second portion of a respective one of the package portions;
   simultaneously forming a plurality of radio frequency conductors on the first opposing side of the semiconductor substrate, each of the plurality of radio frequency conductors having a first end on the first portion of a respective one of the package portions and a second end on the second portion of the respective one of the package portions; and
   attaching a microelectronic die having an integrated circuit formed therein to the first portion of each of the package portions of the semiconductor substrate such that the integrated circuit is electrically connected to the first end of the radio frequency conductor on the respective package portion.

9. The method of claim 8, further comprising separating the semiconductor substrate into the plurality of package portions.

10. The method of claim 9, wherein the semiconductor substrate comprises a semiconductor material, and wherein the semiconductor material is silicon, gallium arsenide, gallium nitride, or a combination thereof.

11. The method of claim 10, wherein the semiconductor substrate is a semiconductor wafer.

12. The method of claim 11, wherein the integrated circuit in each of the microelectronic dies is a millimeter wave (mmW) device.

13. The method of claim 12, further comprising forming a plurality of conductive vias in each of the package portions of the semiconductor substrate, each of the conductive vias extending between the first and second opposing sides of the semiconductor substrate.

14. The method of claim 13, wherein at least some of the conductive vias are formed in the first portion of each of package portions of the semiconductor substrate and are electrically connected to the integrated circuit when the respective microelectronic die is attached to the first portion of the package portion.

15. The method of claim 8, further comprising:
   providing a second semiconductor substrate having first and second opposing sides and comprising a plurality of second package portions, each of the second package portions having a first portion and a second portion;

simultaneously forming a plurality of second tuning depressions on the second opposing side of the second semiconductor substrate, each of the plurality second tuning depressions being on the second portion of a respective one of the second package portions;

simultaneously forming a plurality of die depressions on the second opposing side of the second semiconductor substrate, each of the plurality die depressions being on the first portion of a respective one of the second package portions; and attaching each of the second package portions of the second semiconductor substrate to a respective one of the package portions of the semiconductor substrate such that the first opposing side of each of the package portions is adjacent to the second opposing side of the respective second package portion, the microelectronic die on each package portion is at least partially positioned within the die depression of the respective second package portion, and the second end of each radio frequency conductor is positioned between the respective first and second tuning depressions.

16. A method for forming a microelectronic assembly comprising:

providing a first semiconductor substrate having a first portion, a second portion, first and second opposing sides, a first tuning depression on the second opposing side and the second portion, and a radio frequency conductor on the first opposing side, the radio frequency conductor having a first end on the first portion and a second end on the second portion;

attaching a microelectronic die having an integrated circuit formed therein to the first opposing side and the first portion of the first semiconductor substrate such that the integrated circuit is electrically connected to the first end of the radio frequency conductor; and attaching a second semiconductor substrate to the first semiconductor substrate, wherein the second semiconductor substrate has a third portion, a fourth portion, third and fourth opposing sides, a second tuning depression on the fourth opposing side and the fourth portion, and a die depression on the fourth opposing side and the third portion, wherein the second semiconductor substrate is attached to the first semiconductor substrate so that the first opposing side of the first semiconductor substrate is adjacent to the fourth opposing side of the second semiconductor substrate, and wherein the second end of the radio frequency conductor is positioned between the first and second tuning depressions, and the microelectronic die is at least partially positioned within the die depression.

17. The method of claim 16, wherein the semiconductor substrate comprises silicon, gallium arsenide, gallium nitride, or a combination thereof.

18. The method of claim 17, wherein the integrated circuit is a millimeter wave (mmW) device.

19. The method of claim 18, further comprising:

forming a plurality of first conductive vias in the first semiconductor substrate extending between the first and second opposing sides of the first semiconductor substrate; and forming a plurality of second conductive vias in the second semiconductor substrate extending between the third and fourth opposing sides of the second semiconductor substrate.

20. The method of claim 19, wherein at least some of the first conductive vias are in the first portion of the first semiconductor substrate and are electrically connected to the integrated circuit when the microelectronic die is attached to the first portion of the first semiconductor substrate.

* * * * *